(12) United States Patent
Kuroda

(10) Patent No.: US 7,579,748 B2
(45) Date of Patent: Aug. 25, 2009

(54) PIEZOELECTRIC DEVICE AND METHOD FOR MANUFACTURING THEREOF

(75) Inventor: Katsumi Kuroda, Minowa (JP)

(73) Assignee: Epson Toyocom Corporation (JP)

( * ) Notice: Subject to any disclaimer, the term of this patent is extended or adjusted under 35 U.S.C. 154(b) by 0 days.

(21) Appl. No.: 11/840,331

(22) Filed: Aug. 17, 2007

(65) Prior Publication Data

US 2008/0042523 A1 Feb. 21, 2008

(30) Foreign Application Priority Data

Aug. 18, 2006 (JP) ............................. 2006-223317
Sep. 15, 2006 (JP) ............................. 2006-251357

(51) Int. Cl.
*H01L 41/08* (2006.01)
*H01L 41/22* (2006.01)

(52) U.S. Cl. .................... 310/312; 29/25.35
(58) Field of Classification Search ............ 29/25.35; 310/312

See application file for complete search history.

(56) References Cited

U.S. PATENT DOCUMENTS

| | | | |
|---|---|---|---|
| 2005/0139484 A1* | 6/2005 | Brooks et al. | 205/687 |
| 2005/0151957 A1* | 7/2005 | Stierle et al. | 356/5.15 |
| 2005/0258133 A9* | 11/2005 | Maynard | 216/2 |
| 2006/0082261 A1 | 4/2006 | Tanaya | |

FOREIGN PATENT DOCUMENTS

| | | |
|---|---|---|
| JP | 2000-022013 | 1/2000 |
| JP | 2005-151336 | 6/2005 |
| JP | 2005-244500 | 9/2005 |
| JP | 2006-148857 | 6/2006 |
| JP | 2006-196932 | 7/2006 |

* cited by examiner

*Primary Examiner*—Thomas M Dougherty
(74) *Attorney, Agent, or Firm*—Harness, Dickey & Pierce, P.L.C.

(57) ABSTRACT

A piezoelectric device, includes: a package; a piezoelectric resonator element housed in the package; a lid made of metal and bonded to the package by seam welding to seal the package air-tightly; a metal film for frequency adjustment that is provided to the piezoelectric resonator element; and a window part provided to the lid and enabling a light to transmit therethrough.

3 Claims, 7 Drawing Sheets

PIEZOELECTRIC DEVICE AND METHOD FOR MANUFACTURING THEREOF

BACKGROUND

1. Technical Field

The present invention relates to a piezoelectric device in which a piezoelectric resonator element is housed in a package, and a method for manufacturing a piezoelectric device.

2. Related Art

Piezoelectric devices, including a piezoelectric resonator and a piezoelectric oscillator housing a piezoelectric resonator element in a package, have been widely used for small information equipment, such as hard disc drives (HDD), mobile computers and integrated circuit (IC) cards, for mobile communications equipment, such as cellular phones, car phones and paging systems, and for measuring instruments such as gyro sensors.

Namely, such piezoelectric devices are known that a piezoelectric resonator element is housed in a package and then the package is sealed by a lid such as a glass plate.

FIG. 13 shows such piezoelectric device 1 (see FIG. 1 of JP-A-2006-196932).

Referring to the figure, the piezoelectric device 1 includes a package (base) 2 made of ceramic and houses a piezoelectric resonator element 3 in the package 2 in a manner that a base portion 4 of the piezoelectric resonator element 3 is bonded to an electrode part in the package with a conductive adhesive 5.

Between a bonding surface being an upper end of the package 2 and a lid 6 made of glass, a low-melting glass 7 is disposed. Then a brazing material that is the low-melting glass is heated to be melted, bonding the lid 6 to the package 2 air-tightly.

Here, in the structure of FIG. 13, the lid 6 is bonded with the low-melting glass. The low-melting glass needs relatively large bonding surface, namely an area of a bonding allowance for the package 2 and the lid 6.

However, the large bonding allowance is hard to be maintained in the package 2 that is miniaturized. The bonding allowance is 0.4 mm or less, for example 0.2 mm, in width, at present. Therefore, if the low-melting glass is used as the brazing material, the bonding strength decreases, causing insufficient air-tightness of the package.

Further, in a case where the lid is made of material other than glass as well, if frequency of the piezoelectric resonator element 3 housed in the package can be adjusted after the package is sealed by the lid, a piezoelectric device miniaturized and having excellent frequency accuracy can be obtained preferably.

SUMMARY

An advantage of the present invention is to provide a piezoelectric device and a method for manufacturing thereof in which the lid can be bonded without losing the air-tightness and the frequency can be adjusted accurately.

A piezoelectric device according to a first aspect of the invention, includes: a package; a piezoelectric resonator element housed in the package; a lid made of metal and bonded to the package by seam welding to seal the package air-tightly; a metal film for frequency adjustment that is provided to the piezoelectric resonator element; and a window part provided to the lid and enabling a light to transmit therethrough.

In this structure, even when the package is formed small in size and the bonding area with the lid is formed small accordingly, the lid is bonded by seam welding with the metal brazing material at the limited bonding area, providing sufficient bonding strength. The package can preferably maintain the air-tightness.

The lid for sealing the package is provided with the transparent window part. Therefore, if heating beam such as a laser light is transmitted to be introduced to the inside of the window part, the metal film for adjusting frequency that is formed on the piezoelectric resonator element can be partially transpired, thus being able to adjust the frequency by mass reduction.

Thus, according to the aspect of the present invention, such piezoelectric device can be provided that the lid can be bonded without losing the air-tightness and the frequency can be adjusted accurately.

In the piezoelectric device of the aspect, the lid may be a plate being long in one direction, and may be provided with the window part, that is formed by bonding a glass to a through-hole to be the window part, near one end part thereof in a length direction.

According to the structure, the glass part does not break away or separate from the metal of the lid during the seam welding started from the one end part of the lid, and the lid made of metal and provided with the transparent window part can be appropriately welded to the package.

In the piezoelectric device of the aspect, the lid may be made of kovar, and a kovar glass may be fixed at the window part.

According to the structure, the kovar glass goes with the metal lid made of kovar, and can be preferably bonded to the through-hole formed on the lid.

A piezoelectric device according to a second aspect of the invention, includes: a package; a piezoelectric resonator element housed in the package; a lid made of metal and bonded to the package by seam welding to seal the package air-tightly; and a portion defining a through-hole for hole sealing that is filled with metal to be sealed.

According to the structure, the package includes the through-hole for hole sealing, so that the degree of vacuum in the package can be improved by discharging gas from the through-hole after the lid sealing. In addition, even when the package is formed small in size and the bonding area with the lid is formed small accordingly, the lid is bonded by seam welding with the metal brazing material at the limited bonding area, providing sufficient bonding strength. Thus the package can preferably maintain the air-tightness.

Thus, according to the aspect of the invention, such piezoelectric device can be provided that the lid can be bonded without losing the air-tightness even when the package that is small in size is used.

In the structure of the aspect, the package is provided with the portion defining a through-hole as the sealing hole, and the sealing hole is filled with a metal filler made of gold-germanium alloy.

According to the structure of the aspect, the package includes the through-hole for the hole sealing, so that the degree of vacuum in the package can be improved by discharging gas from the through-hole after the lid sealing. In addition, the metal to be filled to the through-hole is the gold-germanium (Au—Ge) based alloy that has relatively low melting point, so that it is easily handled in the hole sealing process. Further, the gold-germanium based alloy does not melt at common reflow temperature in the reflow process of the piezoelectric device, not losing the air-tight property in the reflow process.

In the piezoelectric device according to the aspect of the invention, the package may be a rectangular box-like package and may include an electrode part for bonding the piezoelectric resonator element, the electrode part being formed along both edges of end parts in a width direction of an inner bottom surface of the package, and the piezoelectric resonator element may include: a base made of a piezoelectric material; a plurality of resonating arms extending from one end of the base; and a pair of supporting arms formed by extending a part of the base in a width direction, the part being on a position apart from one end part of the base at a predetermined distance, and extending in a same direction as the resonating arms at both outside positions of the resonating arms so as to be formed in a unified manner with the base via a connecting part, and respectively bonded to the electrode part for bonding.

According to the structure of the aspect, the piezoelectric resonator element housed in the package includes the pair of the supporting arms extending in a same direction as the resonating arms at both outside positions of the resonating arms, and thus bonded and fixed with respect to the package at the supporting arms.

Therefore, the resonating arms, which perform a flexural vibration, of the piezoelectric resonator element are apart from the bonding part of the package and the lid (an area along the outer periphery) with more distance than common tuning fork type piezoelectric resonator elements. Therefore, the splash of the molten metal is prevented from attaching the resonating arms, which perform the flexural vibration, in seam-welding the bonding part of the package and the lid, giving no adverse affect to the vibration property.

A method for manufacturing a piezoelectric device, according to a third aspect of the invention, which is formed by bonding a piezoelectric resonator element to an inside of a package and sealing by a lid made of metal, includes: a) forming the package, the piezoelectric resonator element, and the lid individually; b) bonding to mount the piezoelectric resonator element in the inside of the package; c) sealing the package by the lid air-tightly; and d) irradiating with a laser light from and outside via a window part that is made of glass and provided to the lid so as to transpire a part of a metal film for frequency adjustment, the metal film being provided to the piezoelectric resonator element. In the step c), a metal brazing material is disposed between a metal part that is formed on a bonding surface of the package, and the lid, and the metal brazing material is molten with an electrode current applied from a side of the lid so as to bond the package and the lid.

According to the method of the aspect, even when the package is formed small in size, the lid is bonded to the package by seam welding in the lid sealing process, providing sufficient bonding strength. Therefore, the piezoelectric device can obtain preferable air-tightness property. In addition, the inside of the package is degassed in the hole sealing process, providing high degree of vacuum. Further, after sealing the lid, the laser light is guided through window part from the outside of the package so as to adjust the frequency of the piezoelectric resonator element.

Thus, according to the aspect of the present invention, such method for manufacturing a piezoelectric device can be provided that the lid can be bonded without losing the air-tightness and the frequency can be adjusted accurately.

A method for manufacturing a piezoelectric device, according to a fourth aspect of the invention, which is formed by bonding a piezoelectric resonator element to an inside of a package and sealing by a lid made of metal, comprising: a) forming the package, the piezoelectric resonator element, and the lid individually; b) bonding to mount the piezoelectric resonator element to the inside of the package; c) sealing the package by the lid air-tightly; and d) degassing under heat through a through-hole that is a sealing hole provided to a bottom part of the package, and melting and filling a metal material in the sealing hole so as to seal the hole, after the step c). In the step c), a metal brazing material is disposed between a metal part that is formed on a bonding surface of the package, and the lid, and the metal brazing material is molten with an electric current applied from a side of the lid so as to bond the package and the lid.

According to the structure of the aspect, even when the package is formed small in size, the lid is bonded to the package by seam welding in the lid sealing process, providing sufficient bonding strength. Thus, the piezoelectric device can obtain preferable air-tightness property. In addition, the inside of the package is degassed in the sealing process, providing high degree of vacuum.

Thus, the aspect of the invention can provide such method for manufacturing a piezoelectric device that the lid can be bonded without losing the air-tightness even when the package that is small in size is used.

According to the method of the aspect, there is a process degassing under heat through the through-hole that is the sealing hole provided to a bottom part of the package, and melting and filling the metal material in the sealing hole so as to seal the hole, after the lid sealing process.

According to the structure of the aspect, gas is discharged from the through-hole after the lid sealing, so that the degree of vacuum in the package can be improved.

In the method of the aspect, a metal roller that is an electrode for seam welding is brought into contact with an end part of the lid, the part being close to the window part of the lid, to start the welding, and rolled to progress the welding in a manner that the roller moves close to the window part and then apart from the window part, in the lid sealing process.

According to the method of the aspect, even when the glass material of the window part of the lid is exposed to the heat due to the seam welding, the metal roller that is an electrode for seam welding is brought into contact with an end part, which is close to the window part, of the lid, to start the welding, and rolled to progress the welding in a manner that the roller moves close to the window part and then apart from the window part. Accordingly, the glass material and the circumference thereof are not heated exceedingly, so that the glass part does not break away or separate from the metal of the lid. Thus, the lid having such transparent window part can be appropriately seam-welded with respect to the package.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
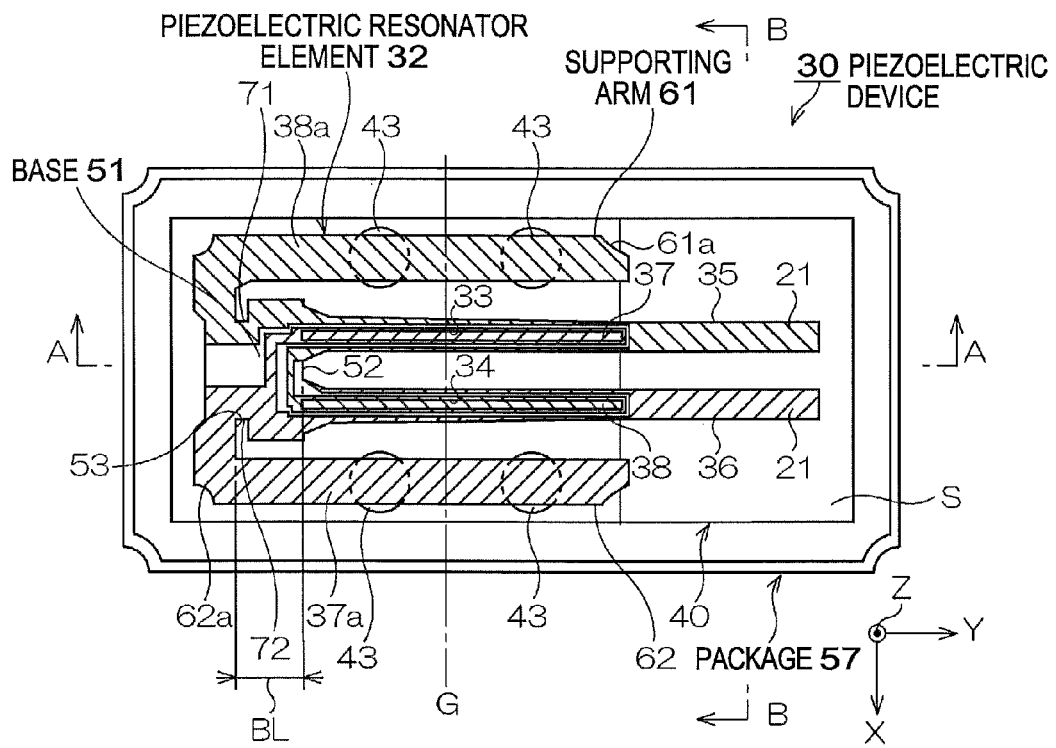
FIG. 1 is a schematic plan view showing a piezoelectric device according to a first and a second embodiments of the invention.
Figure 2:
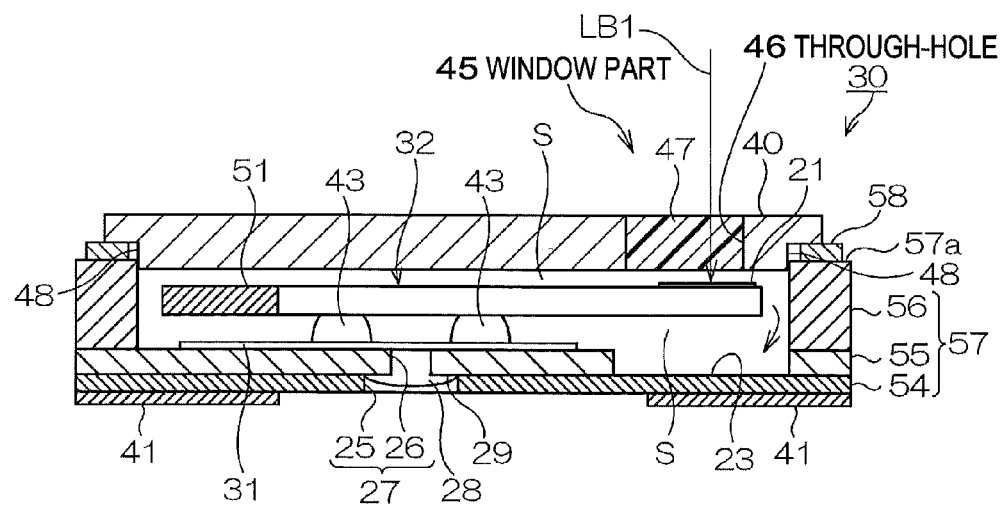
FIG. 2 is a schematic sectional view along A-A of the piezoelectric device of FIG. 1 according to the first embodiment.
Figure 3:
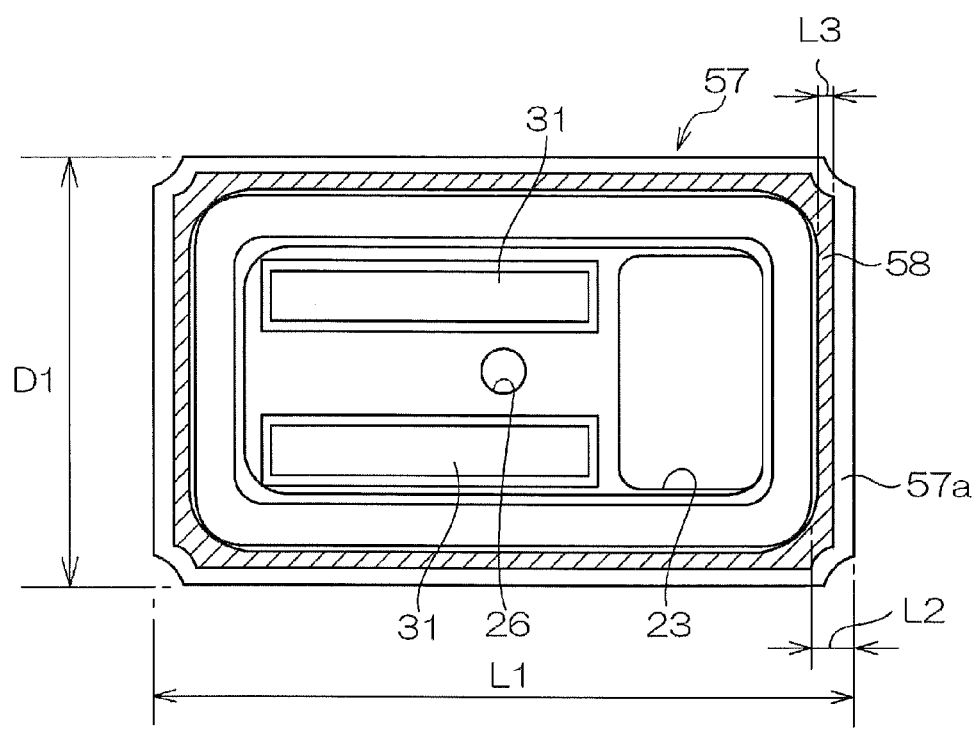
FIG. 3 is a schematic plan view showing a package of the piezoelectric device in FIG. 1 according to the first embodiment.
Figure 4:
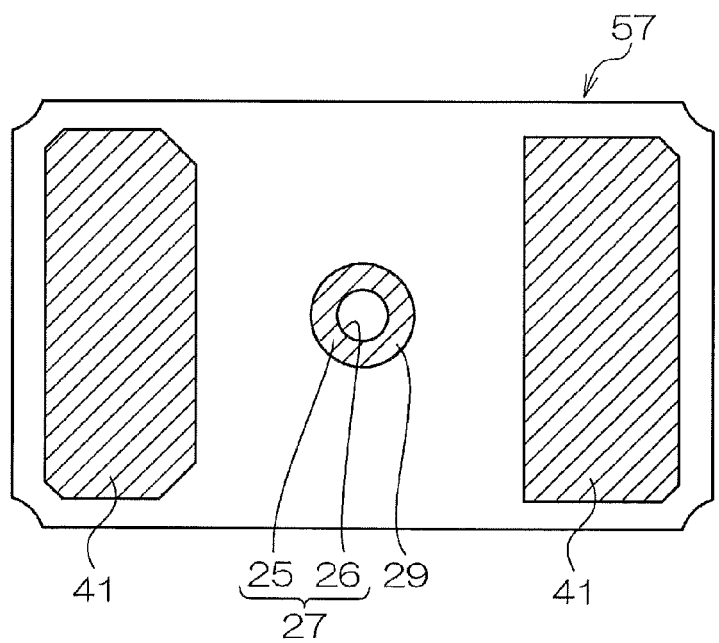
FIG. 4 is a schematic bottom plan view showing a package of the piezoelectric device in FIG. 1 according to the first and the second embodiments.

FIGS. 1 and 2 show a piezoelectric device according to a first embodiment of the present invention. FIG. 1 is a schematic plain view thereof, FIG. 2 is a schematic sectional view along line A-A of FIG. 1, FIG. 3 is a schematic plan view showing a package, and FIG. 4 is a schematic bottom plan view of a package.

Referring to the drawings, this piezoelectric device 30 is an example including a crystal resonator. The piezoelectric device 30 houses a piezoelectric resonator element 32 in a package 57 as a container. The package 57 is like a rectangular box which is formed to be slightly long in one direction as shown in FIGS. 1 to 4.

The package 57 is formed, for example, by multilayering sequentially a plurality of substrates 54, 55, 56 made of aluminum-oxide ceramic green sheets as an insulating material and then firing the substrates. The third substrate 56 is provided with a predetermined hole by removing its inside material, thus forming a predetermined inner space S inside when it is layered. The inner space S is a space for housing the piezoelectric resonator element 32.

The second substrate 55 is provided with a rectangular recessed portion 23 under an end portion of a resonating arm described later of the piezoelectric resonator element 32 by removing a material of the substrate in an area corresponding to the end portion of the arm. Thus, the end portion of the resonating arm is prevented from hitting the inner bottom surface of the package 57 when the end portion is swung downward as shown with an arrow in FIG. 2 due to an external shock, for example.

The piezoelectric resonator element 32 is mounted inside the package 57, and a lid 40 is used for airtight sealing. The lid 40 is made of metal having conductivity. The lid 40 is suitably made of materials whose coefficient of thermal expansion approximates that of the package 57 and is preferably a plate of kovar which is an alloy of iron and cobalt.

As shown in FIG. 2, the lid 40 is provided with a transparent window part 45.

Namely, it is preferable that a through-hole 46 be provided on a position near one end portion (a position near the right side of FIG. 2) of the lid 40 which is long in one direction and the through-hole 46 is filled with a transparent material 47 so as to form the window part 45. Thus an area where light transmits is formed, and accordingly the package inside can be irradiated with laser light LB1 from outside. In this case, part of a metal film (metal film for plummet) 21 for adjusting frequency described later is molten and transpired with the laser light LB1, enabling frequency adjustment by mass reduction. The metal film 21 is formed on the resonating arm of the piezoelectric resonator element 32. It is preferable that a kovar glass (borosilicate glass) be used as the transparent material 47 as described later.

At the bottom of the package 57, a through-hole 27 for hole sealing is provided.

The through-hole 27 is formed at a position near the center of the package 57, for example, as shown in FIG. 4, preferably F formed at a position apart from the recessed portion 23 so as to maintain predetermined strength.

The through-hole 27 is a hole communicating the outside and the inside of the package 57. The through-hole 27 is formed such that a first hole 25 and a second hole 26 having a smaller diameter than the first hole 25 are formed in sequence from the bottom to provide an outward stepped portion 29. The through-hole for hole sealing is not necessary to have such a double-hole structure, but may have a taper-shaped structure in which the hole diameter gradually increases outward. However, the hole is formed to have the stepped portion 29 as this embodiment, providing advantages described later.

The through-hole 27 as a sealing hole is filled with a metal sealant 28 made of Au—Ge, for example, to be sealed airtightly.

As shown in FIG. 3, two electrode parts 31, 31 are provided on an inner bottom of the package 57 in a manner being exposed to the inner space S of FIG. 2.

These electrode parts 31, 31 respectively extend along the length direction of the package at the both end parts in the width direction of the package. The electrode parts 31, 31 can be formed by plating with nickel and gold on a tungsten metallized layer. They are extracted to the outside of the package or conductive through-hole not shown are provided, so that they are coupled to mounting terminals 41, 41 formed on the outer bottom surface of the package 57.

Thus, the electrode parts 31, 31 are coupled to the outside to provide a driving voltage. On the electrode parts 31, 31, conductive adhesives 43, 43 are applied as shown in FIGS. 1 and 2, and supporting arms for a piezoelectric resonator element described later are disposed on the conductive adhesives 43, 43 which are to be cured to bond the electrode parts 31, 31 and the supporting arms.

Examples of the conductive adhesives 43, 43 may include a synthetic resin agent, as an adhesive component having adhesive force, containing conductive particles such as silver fine particles. Silicone-based, epoxy-based, and polyimide-based conductive adhesives can be used.

Alternatively, metal bumps such as gold bump can be used to bond when the conductive adhesives are not used.

As shown in FIG. 3, the package 57 of the embodiment is small in size, and vertical dimension (D1) thereof is 2.0 mm and horizontal dimension (L1) thereof is 1.2 mm, for example. Bonding allowance L2 of the package 57 with respect to the lid is about 0.2 mm.

On the bonding surface of the package 57, a seam ring 58, for example, as a metal brazing material is preformed. The seam ring 58 is about 0.2 mm to 0.15 mm wide. The seam ring 58 may be preformed on the lid 40.

The piezoelectric resonator element 32 is formed small in size and has a structure shown in FIG. 1 to provide required performance in the embodiment.

In particular, the piezoelectric resonator element 32 is made of quartz, for example. Other than quartz, other piezoelectric materials such as lithium tantalate, and lithium niobate can be used. The piezoelectric resonator element 32 includes the base 51, and a pair of resonating arms 35, 36 as shown in FIG. 1. The resonating arms 35, 36 extend toward the right side in parallel with each other from one end (the left end in the figure) of the base 51.

Preferably, on the front and back surfaces of the main surface of the resonating arms 35, 36, long grooves 33, 34 that extend in the length direction are respectively formed. The long grooves 33, 34 are respectively provided with exciting electrodes 37, 38 that serve as driving electrodes.

In the embodiment, the end part of each of the resonating arms 35, 36 is gradually widened as slightly tapered, playing a role of a plummet with its increased weight. As a result, the resonating arms easily perform a flexural vibration.

In addition, the piezoelectric resonator element 32 is provided with the supporting arms 61, 62. The supporting arms 61, 62 are formed by extending an end part of the base 51 in the width direction at a position (the left end as viewed in the figure) apart from the other end part provided with the resonating arms at the given distance BL2 (the length of the base and a cutout part), and extending in the direction in which the resonating arms 35, 36 extends (to the right in FIG. 1) in parallel with the resonating arms 35, 36 at outside positions of both of the resonating arms 35, 36.

Each of the outer shape of the piezoelectric resonating element 32 having such tuning-fork-like shape and the long groove provided to each of the resonating arms can be precisely formed, for example, by wet-etching a material such as a quartz wafer with a hydrofluoric solution or dry-etching it.

Exciting electrodes 37, 38 are provided in the long grooves 33, 34, and to a side surface of each of the resonating arms. In each of the resonating arms, the electrode in the long groove and the electrode on the side surface have opposite polarity. The exciting electrodes 37, 38 are respectively led around to the supporting arms 61, 62 as lead-out electrodes 37a, 38a. Accordingly, in a case where the piezoelectric device 30 is mounted to a mounting substrate or the like, a driving voltage from an outside goes through the mounting terminal 41, 41, the electrode parts 31, 31, and the lead-out electrodes 37a, 38a in the supporting arms 61, 62, in sequence to the exciting electrodes 37, 38.

Then the driving voltage is applied to the exciting electrodes in the long grooves 33, 34, accordingly being able to increase the electric field efficiency in the inside of a region including the long groove in each resonating arm at the time the device is driven.

The exciting electrodes 37, 38 are formed such that an electrode layer is formed with metal that is excellent in conductivity, on a lower metal layer.

In the embodiment, a chrome (Cr) layer is formed as the lower metal layer, and a gold (Au) layer is formed as an electrode layer thereon so as to form the electrode having a shape shown in FIG. 1 by photolithography, for example, in a process described later.

In this case, each layer of the lower layer and the electrode layer not shown are formed by sputtering or vapor-deposition. However, each layer is preferably formed by vapor-deposition in a batch process for forming a plurality of piezoelectric resonator elements from a quarts wafer.

In addition, as shown in FIG. 1, the base 51 is preferably provided with concaved portions that are formed by partially reducing the dimension of the base 51 in the width direction, namely provided with cut-out parts 71, 72 formed at the both side edges sufficiently apart from the end part provided with the resonating arms.

Accordingly, when the resonating arms 35, 36 perform a flexural vibration, the vibration is suppressed from passing through the base 51 to transmit to the supporting arms 61, 62, being able to reduce a crystal impedance (CI) value.

Here, in a case where the strength allows, a through-hole not shown is formed near the center of the base 51 to concentrate stress to the vicinity of the circumference of the through-hole. Accordingly, the vibration can be prevented from transmitting to the supporting arms 61, 62, thereby being able to reduce the CI value.

In terms of the bonding position of the supporting arms 61, 62 and the package 57, only one bonding position can be chosen for the supporting arm 61, for example, on a position corresponding to the center of gravity G of the length dimension of the piezoelectric resonator element 32, in FIG. 1. However, as shown in FIG. 1, two points that are apart at equal distance from the center of gravity G are chosen to be used as the bonding positions, so that the bonding structure is preferably enhanced to be stable.

In a case bonding one supporting arm at one point, it is preferable for achieving a sufficient bonding strength that the length of a region for applying an adhesive be maintained to be 25% or more of the whole length of the piezoelectric resonating element 32.

In a case providing two bonding points (four points on both of the supporting arms) as described in the embodiment, it is preferable for achieving a sufficient bonding strength that the distance between the two bonding positions be set to be 25% or more of the whole length of the piezoelectric resonating element 32.

[Method for Manufacturing Piezoelectric Device]

A method for manufacturing the piezoelectric device 30 will be now described.

Figure 6:
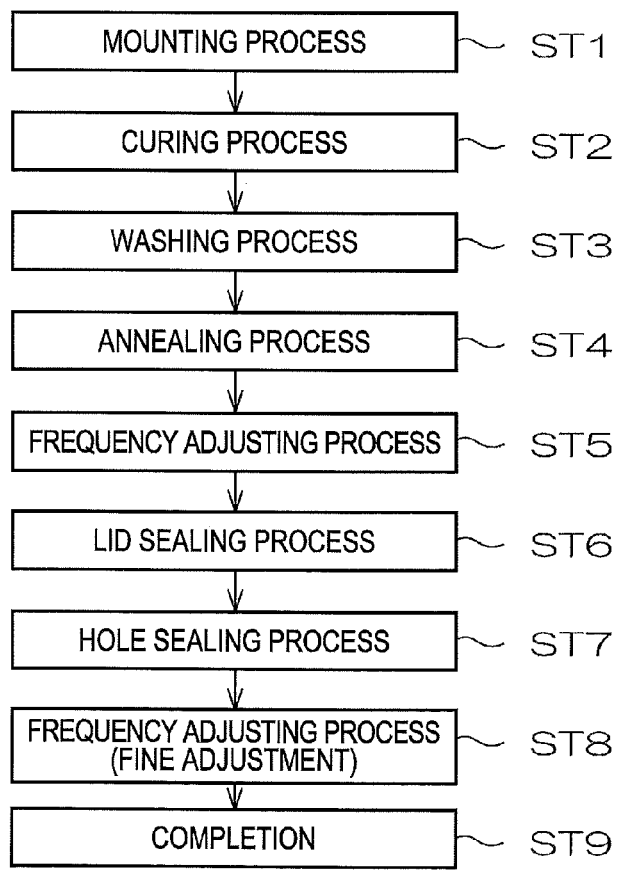
FIG. 6 is a flowchart showing a method for manufacturing the piezoelectric device in FIG. 1 according to the first embodiment.

FIG. 6 is a schematic flowchart for explaining the method for manufacturing the piezoelectric device 30 according to the embodiment of the invention.

[Pre-Process]

The piezoelectric resonator element 32, the package 57, and the lid 40 of the piezoelectric device 30 are individually manufactured as a pre-process.

The lid 40 is made of the conductive metal as described. In the embodiment, a kovar plate, for example, is processed to be in a predetermined size and plated with nickel, providing the lid.

Figure 5:
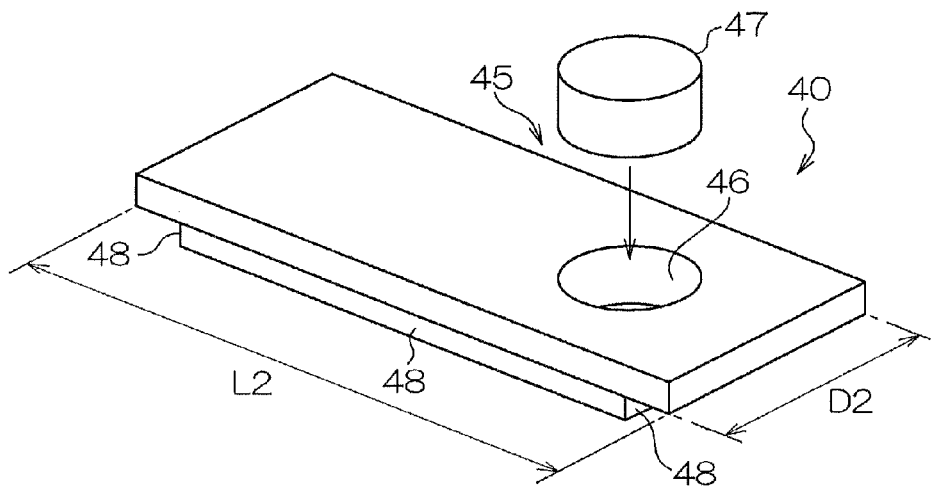
FIG. 5 is a schematic view explaining a formation of a lid provided to the piezoelectric device in FIG. 1 according to the first embodiment.

In particular, the lid 40 is a rectangular thin plate being long in one direction, as shown in FIG. 5. The circumference of the bottom surface of the lid 40 is made thinner so as to provide a stepped portion 48 along the circumference.

As shown in FIG. 2, the stepped portion 48 is brought into contact with the inner circumference at the top edge of the package 57 to be easily positioned in bonding the lid 40 and the package 57.

A through-hole 46 is formed on a position close to one end, that is a position close to the right side of FIG. 5, in the length direction (left-right direction in FIG. 5) of the lid 40, and then the transparent material 47 is bonded to the through-hole 46, providing the window part 45.

The window part 45 is preferably provided at the position completely apart from the center part in the length direction. It is preferable that the window part 45 be formed on a position directly above the metal film 21 for adjusting the frequency provided at the end of the resonating arms of the piezoelectric resonator element 32.

Here, in terms of the size of the lid 40, the length L2 is 1.9 mm, and the width D2 is 1.05 mm, for example, in the embodiment. The outer shape (outer size) of the lid 40 is smaller than that of the package 57. In addition, the diameter Ø of the window part 45 is 0.5 mm, the distance D3 from the outer edge of the long side of the lid 40 to the outer circumference of the window part 45 is 0.275 mm, and the distance L3 from the outer edge of the short side of the lid 40 to the outer circumference of the window part 45 is 0.28 mm, for example.

The transparent material 47 bonded to the through-hole 46 is preferably glass. Particularly, when the lid 40 is made of kovar that is an alloy of iron and cobalt, or of kovar alloy that is a ternary alloy of iron, cobalt, and other metal, the transparent material 47 preferably is kovar glass that is borosilicate glass.

Namely, a predetermined number of the through-holes 46 are formed with respect to a kovar plate having enough size to cut out the lid 40 or a plurality of or many of the lids 40, and then the transparent material 47 made of glass material in a bulk form is disposed in each of the through-holes 46. Then the plate is heated and melted. Accordingly the transparent material 47 can be appropriately bonded to the lid 40.

The through-hole 46 may be formed in a tapered shape in which the diameter decreases downward in the thickness direction of the lid 40. Thus, the transparent material in a bulk form is disposed along the inner diameter of the through-hole 46, making the formation of the window easier.

The package 57 is formed, as above described, by multi-layering a plurality of substrates formed by shaping aluminum-oxide ceramic green sheets, and then firing the substrates. In the shaping of each of the plurality of substrates, a predetermined hole is formed thereinside by pressing so as to form the predetermined inner space S or the through-hole 27 inside when they are multilayered.

In addition, a conductive pate such as a silver paste is applied to regions for the electrode parts 31, 31 of FIG. 3, for the stepped portion 29 of the through-hole 27 of the FIG. 4, or for the mounting terminals 41, 41 before the firing, and a metal film for the electrode parts and the like can be formed by plating after the firing.

In a case where the piezoelectric resonator element 32 having a tuning fork shape is formed from a quartz wafer and the like, the quartz wafer is cut out from a single crystal of quartz to set its electric axis, mechanical axis, and optical axis to be X-axis, Y-axis, and Z-axis respectively, as shown in FIG. 1.

The orthogonal coordinate system is composed of the X-axis, the Y-axis, and the Z-axis. In order to obtain the quartz wafer from the single crystal of quartz, the single crystal is rotated within several degrees in clock wise around the Z-axis, cut out to be the quartz Z plate, then, it is cut and polished to have a predetermined thickness.

Then a required corrosion resistant film not shown is provided to the quartz wafer, and portions corresponding to the long gloves 33, 34 of the resonating arms are formed by half-etching with hydrofluoric acid solution while using the resistant film as a mask.

The exciting electrode as a driving electrode will now be formed.

In particular, a metal film to be an electrode will be formed on the front and back surfaces of the quartz wafer. The metal film is formed by vapor-depositing or sputtering gold on a chrome layer as a lower layer.

Then respective electrodes described in FIG. 1 are formed by photolithography.

Next, a mask pattern not shown and corresponding to the outer shape including the resonating arms and the base is formed with the corrosion resistant film, for example, so as to form the outer shape of the piezoelectric resonator element 32 including the supporting arms by wet-etching with hydrofluoric acid solution and the like (see FIG. 1). Then the exciting electrode is formed on each of the side surfaces of the resonating arms 35, 36 of the piezoelectric resonator element 32. Accordingly, the piezoelectric resonator element 32 is completed.

Here, it is preferable that metal films 21, 21 (for adjusting frequency) as plummets for adjusting frequency be formed at the end parts of the resonating arms 35, 36 of the piezoelectric resonator element 32 to have a same structure as that of the exciting electrodes when the exciting electrodes are formed.

[Mounting Process]

After the above pre-process is performed, the piezoelectric resonator element 32 that is completed will be bonded (ST1).

In particular, the conductive adhesives 43, 43, 43, 43 are applied to the electrode parts 31, 31 of FIG. 3. As shown in FIG. 1, corresponding supporting arms 61, 62 are disposed thereon and some loads are applied on them.

In such state, the conductive adhesives are cured (ST2) by heating in a belt furnace, bonding the piezoelectric resonator element 32.

Here, the piezoelectric resonator element 32 may be bonded by metal bump and the like instead of the conductive adhesives. In that case, the curing process is not necessary.

Then after washed with purified water (ST3), the whole is heated in a heating furnace to evaporate the water and to volatilize the solvent thoroughly from the conductive adhesives (ST4).

Further, when the lid 40 is not bonded, the metal films 21, 21 for adjusting frequency provided to the resonating arms 35, 36 of the piezoelectric resonator element 32 are irradiated with laser light from upside to transpire part of the metal films 21, 21 as shown in FIG. 2, thus performing frequency adjustment (coarse adjustment) by mass reduction (ST5).

[Lid Sealing Process]

The lid 40 will be now bonded to the package 57 (ST6).

Figure 7:
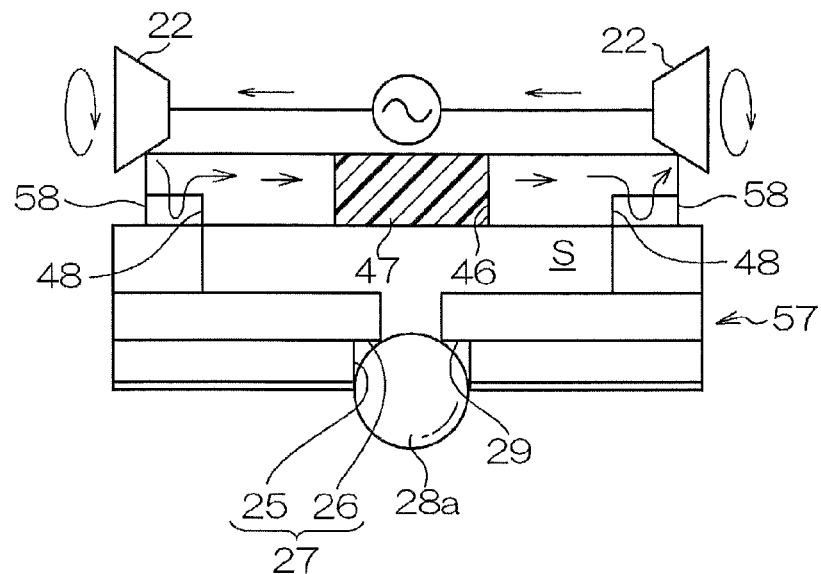
FIG. 7 is a schematic view explaining lid sealing in the method of FIG. 6.
Figure 8:
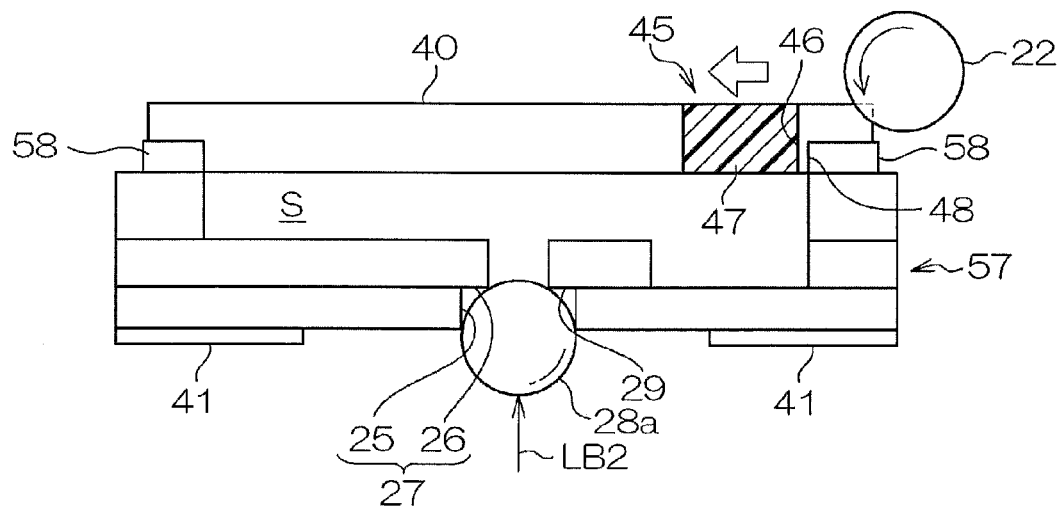
FIG. 8 is a schematic view explaining the lid sealing in the method of FIG. 6.

FIGS. 7 and 8 are schematic views explaining the lid sealing process. The piezoelectric resonator element in the package 57 is not shown in these figures. FIG. 7 shows the sealing process at the section along line B-B of FIG. 1. FIG. 8 shows the sealing process at the section along line A-A of FIG. 1.

The lid 40 is disposed on the package 57 as shown in these figures. At this time, the stepped portion 48 of the lid 40 is brought into contact with the inner circumference at the top edge of the package 57, whereby the lid is easily positioned.

The seam ring 58 that is the metal brazing material is interposed between the package 57 and the lid 40.

In this state, metal rollers 22 to be a welding electrode are applied to top edges on both ends of one side of the lid 40, as shown in FIG. 7. Here, the seam ring 58 is formed in a ring shape, so that one roller 22 is electrically coupled to the other roller 22. Then, the metal rollers 22 are rolled in an arrow direction to be transferred to the other side while being applied with an alternating voltage. As a result, current flows between the metal roller 22 and the lid 40, and between the lid 40 and the seam ring 58, producing Joule heat. This Joule heat is mainly produced on an interface of the lid 40 and the seam ring 58. The Joule heat melts the seam ring 58 to evenly weld the interface of the lid 40 and the package 57, thereby providing an excellent sealing property with high air-tightness.

Here, if the welding heat transmits to the inside of the lid 40 to heat the transparent material 47 excessively, kovar swells at the interface of kovar and glass of the lid described above. Then if the kovar shrinks rapidly after the completion of the welding, the interface may disadvantageously break away.

As shown in FIG. 8, the metal rollers 22 are brought into contact with ends of the side that is close to the window part 45 of the lid 40, and then the metal rollers 22 are rolled, starting the welding. The welding progresses such that the rollers move close to the window 45 and then away from the window part 45 gradually along the arrow direction.

Therefore, kovar surrounding the glass material is not heated excessively at around the glass material that is the transparent material 47, effectively preventing disadvantage that the interface breaks away due to the rapid shrink after the swell of kovar.

Figure 9:
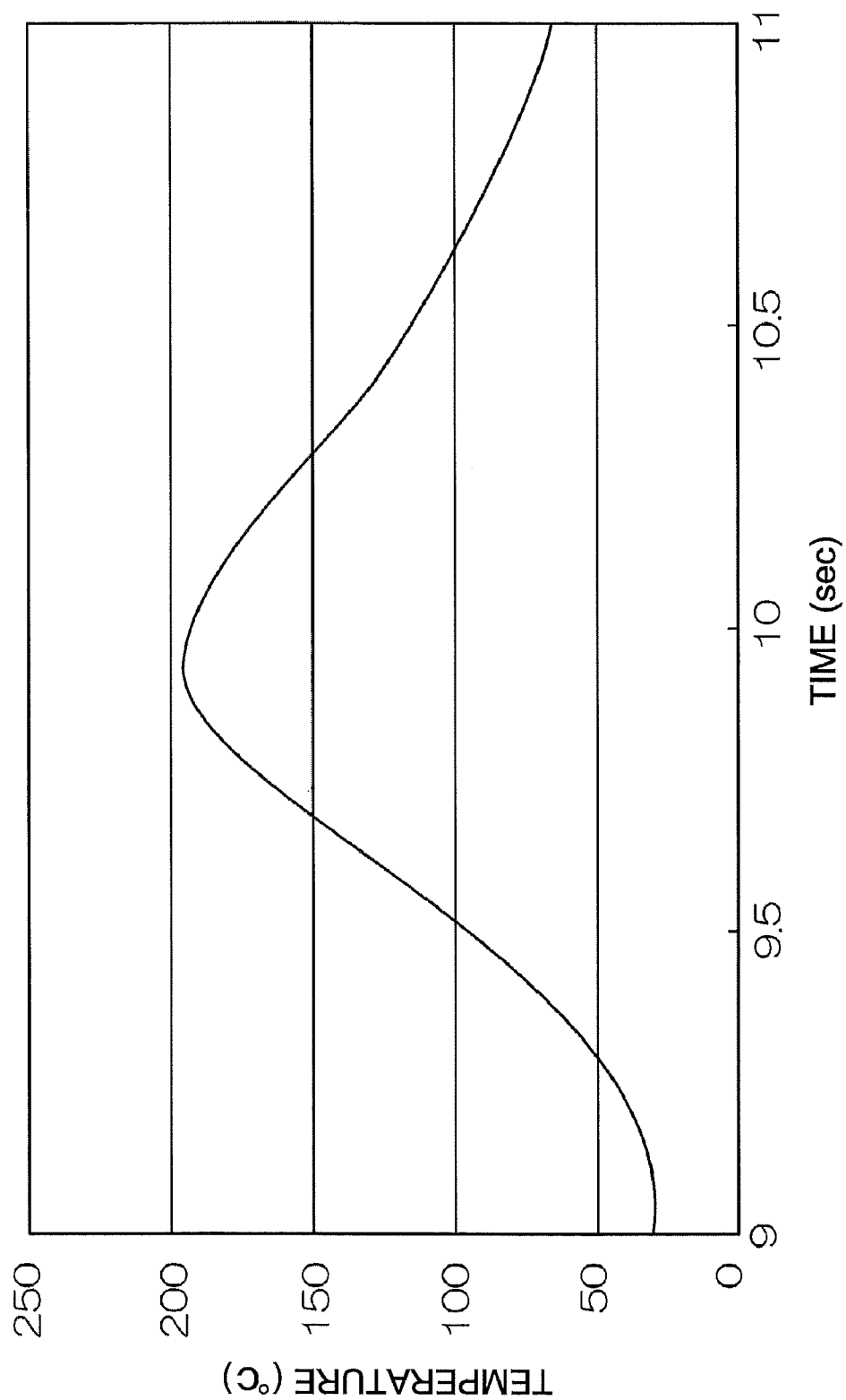
FIG. 9 is a graph showing a simulation result in terms of the lid sealing of FIG. 6.

FIG. 9 shows a result of a simulation in the sealing process according to the embodiment.

The vertical axis indicates the temperature at the central position of the lid 40 sandwiched by the metal rollers 22, and the horizontal axis indicates the time.

The welding was progressed in the following conditions: 120A in the main heat control, 1 kHz of power source frequency, and 3 mm/sec of velocity with which the metal rollers 22 moved over in a manner sandwiching the short side of the package 57 in the longitudinal direction.

In this case, the package 57 was in size with 2.0 mm of the long side and 1.2 mm of the short side.

The experimentation of the inventor shows the following result. When the welding was performed in such state that the metal roller 22 was positioned on the opposite side of the above description, the temperature around the window part 45 rose up about 160 degrees Celsius, but the above method could suppress the rise of the temperature at about 90 degrees Celsius.

In the seam welding by which the package 57 and the lid 40 are bonded, splash of the molten metal of the metal brazing material being the seam ring 58 sometimes enters the inside of the package 57. If such splash attaches the resonating arms 35, 36 of the piezoelectric resonator element 32, the arms increase in weight, changing the frequency.

However, the piezoelectric resonator element 32 housed in the package 57 according to the embodiment includes a pair of the supporting arms 61, 61 at the outside positions of both resonating arms 35, 36, namely at outside positions apart from the resonating arms in the width direction as described in FIG. 1. Thus the piezoelectric resonator element 32 is bonded to the package 57 at the supporting arms 61, 61.

Therefore, the resonating arms 35, 36 of the piezoelectric resonator element 32 are apart from the bonding part of the package 57 and the lid 40 (an area along the outer periphery, that is a part corresponding to the seam ring 58) with more distance than common tuning fork type piezoelectric resonator elements. Therefore, the splash of the molten metal is prevented from attaching the resonating arms 35, 36 of the piezoelectric resonator element 32 in the seam welding, giving no adverse affect to the vibration property.

[Hole Sealing Process]

Hole sealing process (ST7) will be now described.

Heating process is preferably added before the hole sealing.

In particular, the package 57 is housed in a vacuum heating chamber for example, and heated with the predetermined temperature profile.

As a result, moisture in the package 57, solvent component of the conductive adhesive 43, and the like are sufficiently evaporated. Gas produced in this process is discharged through the through-hole 27 to the outside. Thus gas discharge or degasification makes the inside of the package 57 have a high vacuum degree of about $1 \times 10^{-2}$ Pa.

Then the package 57 in FIG. 7 or 8 is turned upside down, for example, and a metal ball 28a for metal filling is disposed on the stepped portion 29 in the through-hole 27. The metal ball 28a is globose to be easily rolled and put into the hole, facilitating the operation.

As the material of the metal ball 28a, gold-germanium (Au—Ge), and gold-tin (Au—Sn), for example, are favorable. They are alloys including no lead, so that lead to be harmful is not produced even when they are disposed, and they are not molten in common reflow process.

Especially the gold-germanium (Au—Ge) based alloy has relatively low melting point, so that it is easily handled in the hole sealing process. In addition, the gold-germanium based alloy does not melt at common reflow temperature in the reflow process of the piezoelectric device, not losing the air-tight property in the reflow process.

In this state, the metal ball 28a is irradiated with laser light LB2 for hole sealing as shown in FIGS. 7 and 8. Accordingly, the metal ball 28a melts instantly to fill the through-hole 27, and seals the through-hole 27 air-tightly.

As described with FIG. 2, the inside of the package 57 is irradiated with the laser light LB1 from the outside through the window part 45. This irradiation transpires part of the metal film (metal film for plummet) 21 for adjusting frequency formed on the resonating arm of the piezoelectric resonator element 32 so as to adjust frequency by mass reduction. Thus, the frequency can be adjusted with high accuracy (ST8).

After required inspections, the piezoelectric device 30 is completed (ST9).

According to the embodiment, the package 57 includes the through-hole 27 for hole sealing, so that the degree of vacuum in the package 57 can be improved by discharging gas from the through-hole 27 after the lid sealing. In addition, even when the package 57 is formed small in size and the bonding area of the lid 40 is formed small accordingly, the lid 40 is bonded by seam welding with the seam ring 58 at the limited bonding area, providing sufficient bonding strength. Thus, the package can preferably maintain the air-tightness.

Furthermore, the frequency can be adjusted with high accuracy by using the window part 45 after the package is sealed with the lid 40.

[Piezoelectric Device According to Second Embodiment]

Figure 10:
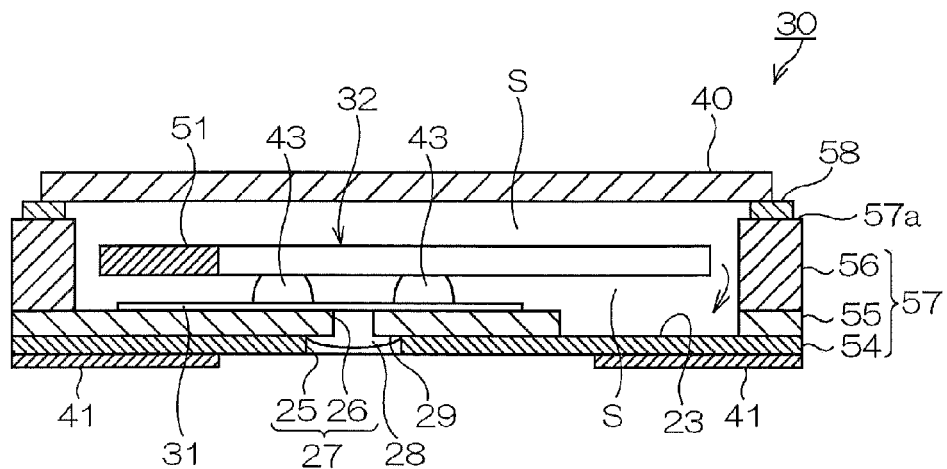
FIG. 10 is a schematic sectional view along A-A of the piezoelectric device of FIG. 2 according to the first embodiment.
Figure 11:
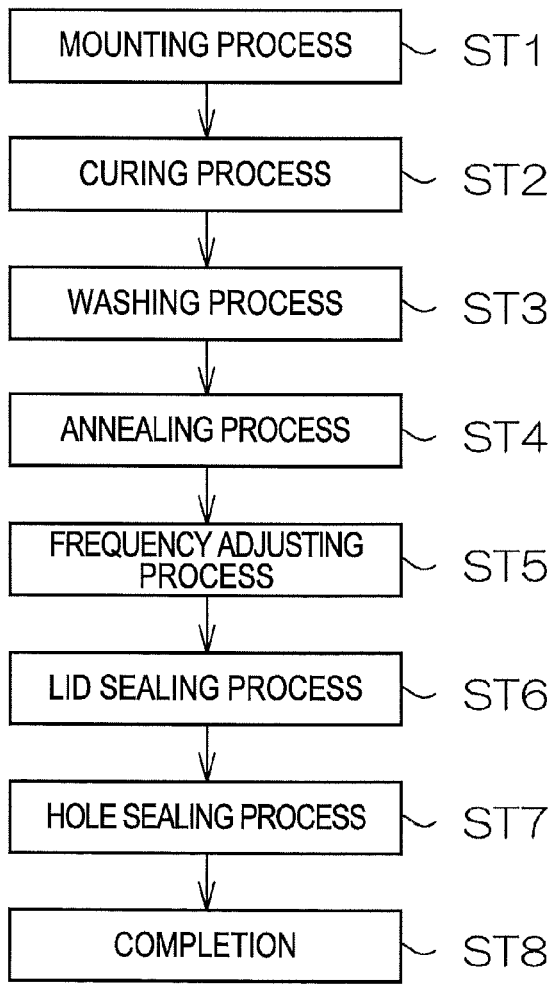
FIG. 11 is a flowchart showing a method for manufacturing the piezoelectric device in FIG. 1 according to the second embodiment.

In the first embodiment, the lid 40 is provided with the window part 45 (FIG. 2) to which kovar glass (borosilicate glass) is to be provided. While, a structure according to a second embodiment does not have the window part 45 of the lid 40 as shown in FIG. 10. Other structures of the second embodiment are common to those of the first embodiment, and a schematic plan view thereof is shown in FIG. 1, a schematic plan view of the package is shown in FIG. 3, and a bottom plan view of the package is shown in FIG. 4.

[Method for Manufacturing Piezoelectric Device According to Second Embodiment]

As is the case with the first embodiment, the piezoelectric resonator element 32, the package 57, and the lid 40 are individually manufactured as a pre-process. After the pre-process is performed, the piezoelectric resonator element 32 that is completed will be bonded (ST1).

In particular, the conductive adhesives 43 are applied to the electrode parts 31 of FIG. 3. As shown in FIG. 1, corresponding supporting arms 61, 62 are mounted and some loads are applied on them.

In such state, the conductive adhesives are cured (ST2) by heating in a belt furnace, bonding the piezoelectric resonator element 32.

Here, the piezoelectric resonator element 32 may be bonded by metal bump and the like instead of the conductive adhesives. In that case, the curing process is not required.

Then after washed with purified water (ST3), the whole is heated in a heating furnace to evaporate the water and to volatilize the solvent thoroughly from the conductive adhesives (ST4).

Further, when the lid 40 is not bonded, the metal films 21 for adjusting frequency provided to the resonating arms 35, 36 of the piezoelectric resonator element 32 is irradiated with laser light from upside to transpire part of the metal films 21 as shown in FIG. 1, thus performing frequency adjustment by mass reduction (ST5). A frequency adjustment process after the lid sealing is omitted differently from the first embodiment, so that the frequency is adjusted with high accuracy in this process.

[Method for Lid-Sealing in Piezoelectric Device According to Second Embodiment]

The lid 40 will be now bonded to the package 57 (ST6).

Figure 12:
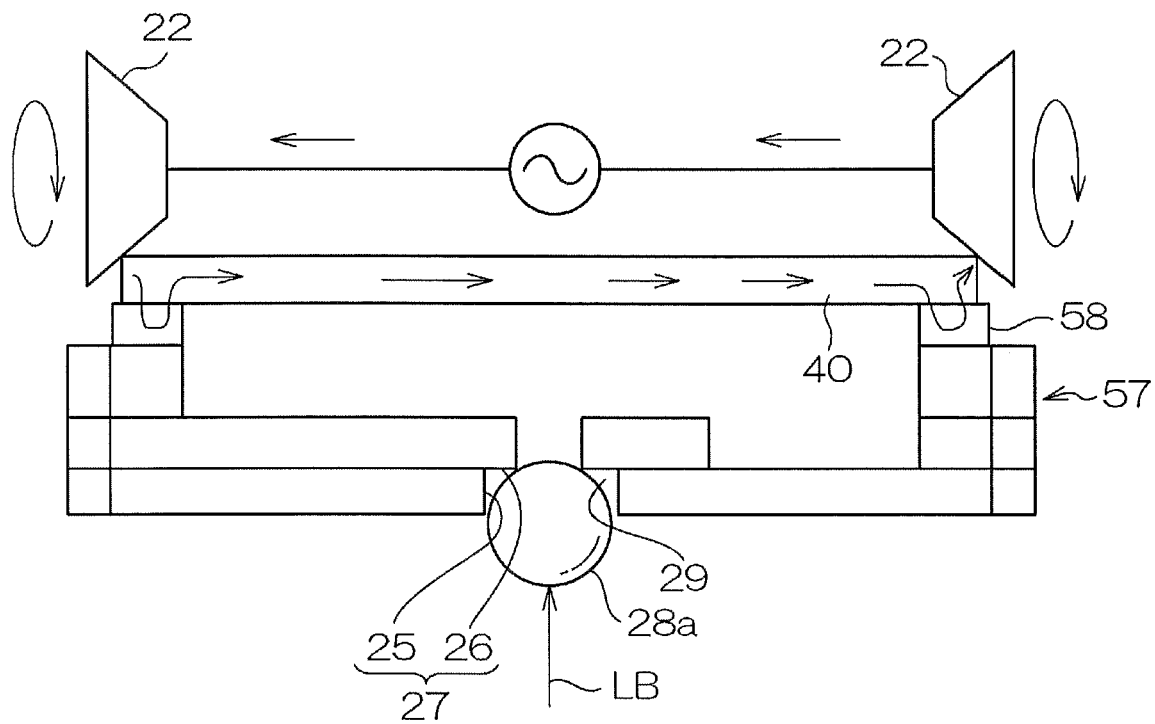
FIG. 12 is a schematic view explaining lid sealing in the method of FIG. 11.
Figure 13:
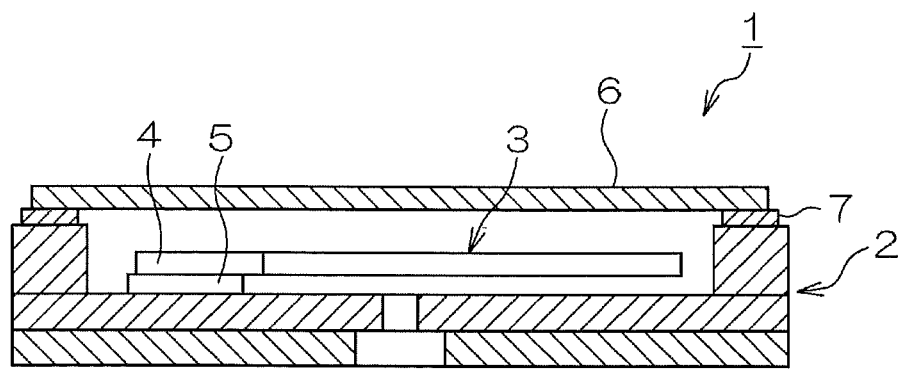
FIG. 13 is a schematic plan view showing a conventional piezoelectric device.

FIG. 12 is a schematic view explaining the lid sealing process. The piezoelectric resonator element in the package 57 is not shown in the figure.

The lid 40 is disposed on the package 57 as shown in the figure.

The seam ring 58 that is the metal brazing material is interposed between the package 57 and the lid 40.

In this state, metal rollers 22 to be a welding electrode are applied to top edges on both ends of one side of the lid 40, as shown in FIG. 12. Here, the seam ring 58 is formed in a ring shape, so that one roller 22 is electrically coupled to the other roller 22. Then, the metal rollers 22 are rolled in an arrow direction to be transferred to the other side while being applied with an alternating voltage. As a result, current flows between the metal rollers 22 and the lid 40, and between the lid 40 and the seam ring 58, producing Joule heat. This Joule heat is mainly produced on an interface of the lid 40 and the seam ring 58. The Joule heat melts the seam ring 58 to evenly weld the interface of the lid 40 and the package 57, thereby providing a favorable sealing property with high air-tightness.

In the seam welding by which the package 57 and the lid 40 are bonded, splash of the molten metal of the metal brazing material that is the seam ring 58 sometimes enters the inside of the package 57. If such splash attaches the resonating arms 35, 36 of the piezoelectric resonator element 32, the arms increase in weight, changing the frequency.

However, the piezoelectric resonator element 32 housed in the package 57 according to the embodiment includes a pair of supporting arms 61, 62 at the outside positions of both resonating arms 35, 36, that is at outside positions apart from the resonating arms in the width direction as described in FIG. 1. Thus the piezoelectric resonator element 32 is bonded to the package 57 at the supporting arms 61, 62.

Therefore, the resonating arms 35, 36 of the piezoelectric resonator element 32 are apart from the bonding part of the package 57 and the lid 40 (an area along the outer periphery, that is a part corresponding to the seam ring 58) with more distance than common tuning fork type piezoelectric resonator elements. Therefore, the splash of the molten metal is prevented from attaching the resonating arms 35, 36 of the piezoelectric resonator element 32 in the seam welding, giving no adverse affect to the vibration property.

[Method for Sealing Hole of Piezoelectric Device According to Second Embodiment]

Hole sealing process (ST7) will be now described.

Heating process is preferably added before the hole sealing.

In particular, the package 57 is housed in a vacuum heating chamber for example, and heated with the predetermined temperature profile. As a result, moisture in the package 57, solvent component of the conductive adhesive 43, and the like are sufficiently evaporated. Gas produced in this process is discharged through the through-hole 27 to the outside. Thus gas discharge or degasification makes the inside of the package 57 have a high vacuum degree of about $1 \times 10^{-2}$ Pa.

Then the package 57 in FIG. 12 is turned upside down, for example, a metal ball 28a for metal filling is disposed on the stepped portion 29 in the through-hole 27. The metal ball 28a is globose to be easily rolled and put into the hole, facilitating the operation.

As the material of the metal ball 28a, gold-germanium (Au—Ge), and gold-tin (Au—Sn), for example, are favorable. They are alloys including no lead, so that lead to be harmful is not produced even when they are disposed, and they are not molten in common reflow process.

Especially the gold-germanium (Au—Ge) based alloy has relatively low melting point, so that it is easily handled in the hole sealing process. In addition, the gold-germanium based alloy does not melt at common reflow temperature in the reflow process of the piezoelectric device, not losing the air-tight property in the reflow process.

In this state, the metal ball 28a is irradiated with laser light LB2 for hole sealing as shown in FIG. 12. Accordingly, the metal ball 28a melts instantly to fill the through-hole 27, and seals the through-hole 27 air-tightly.

After required inspections, the piezoelectric device 30 is completed (ST8).

According to the second embodiment, the package 57 includes the through-hole 27 for hole sealing, so that the degree of vacuum in the package 57 can be improved by discharging gas from the through-hole 27 after the lid sealing. In addition, even when the package 57 is formed small in size and the bonding area of the lid 40 is formed small accordingly, the lid 40 is bonded by seam welding with the seam ring 58 at the limited bonding area, providing sufficient bonding strength. Thus the package can preferably maintain the air-tightness.

It should be understood that the invention is not limited to the above-described embodiments. The structure of each embodiment can be appropriately combined or omitted, and an additional structure not shown can also be combined therewith.

Furthermore, the invention is applicable to any piezoelectric resonator elements and any piezoelectric devices using such piezoelectric resonator elements as long as these elements are housed in a package. Examples of such elements and devices may include crystal resonator elements, crystal oscillators, crystal filters, SAW devices, gyroscopes, and angle sensors.

The entire disclosure of Japanese Patent Application Nos: 2006-223317, filed Aug. 18, 2006 and 2006-251357, filed Sep. 15, 2006 are expressly incorporated by reference herein.

What is claimed is:

1. A method for manufacturing a piezoelectric device, the piezoelectric device being formed by bonding a piezoelectric resonator element to an inside of a package and sealing by a lid made of metal, comprising:
   a) forming the package, the piezoelectric resonator element, and the lid individually;
   b) bonding to mount the piezoelectric resonator element in the inside of the package;
   c) sealing the package by the lid air-tightly; and
   d) irradiating with a laser light from an outside via a window part that is made of glass and provided to the lid so as to transpire a part of a metal film for frequency adjustment, the metal film being provided to the piezoelectric resonator element, wherein in the step c), a metal brazing material is disposed between a metal part, the metal part being formed on a bonding surface of the package, and the lid, and the metal brazing material is molten with an electric current applied from a side of the lid so as to bond the package and the lid.

2. A method for manufacturing a piezoelectric device, the piezoelectric device being formed by bonding a piezoelectric resonator element to an inside of a package and sealing by a lid made of metal, comprising:

a) forming the package, the piezoelectric resonator element, and the lid individually;

b) bonding to mount the piezoelectric resonator element to the inside of the package;

c) sealing the package by the lid air-tightly; and d) degassing under heat through a through-hole that is a sealing hole provided to a bottom part of the package, and melting and filling a metal material in the sealing hole so as to seal the hole, after the step c), wherein in the step c), a metal brazing material is disposed between a metal part, the metal part being formed on a bonding surface of the package, and the lid, and the metal brazing material is molten with an electric current applied from a side of the lid so as to bond the package and the lid.

3. The method for manufacturing a piezoelectric device according to claim 2, wherein a metal roller that is an electrode for seam welding is brought into contact with an end part of the lid, the part being close to the window part of the lid, to start the welding, and rolled to progress the welding in a manner that the roller moves close to the window part and then apart from the window part, in the step c).

* * * * *